United States Patent

Gisser et al.

[11] Patent Number: 5,395,540
[45] Date of Patent: Mar. 7, 1995

[54] PERFLUOROISOHEXENE AS A COOLING AND INSULATING MEDIUM

[75] Inventors: Alfons Gisser, Burgkirchen; Konrad Von Werner, Garching; Joachim Naumann, Kelkheim; Heiner Debrodt, Eschborn; Wilfried Becker, Neuötting, all of Germany

[73] Assignee: Hoechst Aktiengesellschaft, Frankfurt am Main, Germany

[21] Appl. No.: 132,742

[22] Filed: Oct. 6, 1993

[30] Foreign Application Priority Data

Oct. 6, 1992 [DE] Germany .......... 42 33 531.0

[51] Int. Cl.⁶ ................................. C09K 5/04
[52] U.S. Cl. .............................. 252/67; 62/114
[58] Field of Search ............ 252/67; 570/136; 62/114

[56] References Cited

U.S. PATENT DOCUMENTS

| | | | |
|---|---|---|---|
| 4,093,670 | 6/1978 | Ozawa et al. | 260/653.1 R |
| 4,377,717 | 3/1983 | Anello et al. | 570/172 |
| 5,100,572 | 3/1992 | Merchant | 252/171 |

FOREIGN PATENT DOCUMENTS 52-38662 3/1977 Japan .
54-7657 1/1979 Japan .

OTHER PUBLICATIONS

Jomard, T., et al. *EPE Firenze* (2):495–496 (1991).

*Primary Examiner*—Christine Skane
*Attorney, Agent, or Firm*—Connolly & Hutz

[57] ABSTRACT

A mixture of isomers of the formula $C_6F^{12}$, which contains at least 80% by weight of the trans isomer of perfluoro-4-methyl-2-pentene and at most 3% by weight of perfluoro-2-methyl-2-pentene, is suitable as a cooling and insulating medium and can be used as a substitute 1,1,2-trichloro-1,2,2-trifluoroethane.

25 Claims, No Drawings

PERFLUOROISOHEXENE AS A COOLING AND INSULATING MEDIUM

CROSS REFERENCE TO RELATED APPLICATION

U.S. application Ser. No. 08/111,643, filed Aug. 25, 1993 discloses technologically related subject matter, including a method for preparing material useful in this invention.

The dissipated power arising in the components of power electronics in the form of heat must be rejected to a medium, a so-called heat transfer medium, for example if power semiconductors are used for high voltage direct current transmission (HVDCT) or for railroad power supplies. The simplest solution is the insulation and cooling with air. The air, as an insulating gas, takes care of the insulation of the high voltage. The dissipated heat is removed by natural or forced convection. The use of a separate cooling system comprising cooling boxes, through which water is pumped, makes it possible to increase considerably the cooling effect compared to pure air cooling. If a higher disruptive voltage (a measure for the electrical stability of insulating fluids) than that of air is required, an oil or a gas having a higher disruptive voltage can be used instead of air. The cooling types mentioned have in common that the rejection of the dissipated heat is effected by single-phase convection, i.e. without change in the aggregate state of the coolant. If two-phase cooling (principle of evaporation cooling)—also known as "boiling cooling"—is used, the capacity of the cooling system can be increased considerably. Either the heat-generating components are positioned directly in the boiling liquid, or the liquid boils in hollow cooling boxes (bath or box boiling cooling). Two further advantages of the boiling cooling method compared with pure liquid cooling are that, firstly, a pump for circulating the cooling medium is not required, and that, secondly, local overheating is avoided by virtue of natural convection.

A special application of boiling cooling without high voltage insulation is the heat pipe, which transfers heat energy, for example between two gas streams. It consists of a metal tube which contains porous, capillary material or bent wire mesh. This previously evacuated pipe is charged with the cooling medium, and the ends are sealed so as to be vacuum-tight. If heat is supplied to one pipe end, a portion of the liquid located there evaporates and condenses at the cooler end of the pipe fitted with the heat sink. The condensed cooling medium is absorbed by the pipe packing and, owing to the capillary effect of this material, is fed back to the heated end of the pipe as in a wick, resulting in a continuous, closed circulation.

The boiling-cooling fluids used can also be liquid halohydrocarbons. A member of this group, 1,1,2-trichloro-1,2,2-trifluoroethane (code designation CFC 113), by virtue of its good thermal stability, its non-flammability, its low viscosity, its relatively high heat of evaporation and its useful electrophysical and physiological properties, has been found to be particularly suitable as an inexpensive boiling-cooling fluid.

CFC 113 is, however, one of the chlorofluorohydrocarbons which can react with the ozone in the stratosphere by splitting it into oxygen, with the formation of chlorine oxide, and can thus contribute to the depletion of this UV-absorbing layer. For this reason, CFC 113 will in future no longer be allowed to be produced and used. There is therefore an urgent need for a coolant and insulant which can replace CFC 113.

The following requirements should be made of such a CFC 113 substitute:

1. Boiling point or boiling range well below, critical temperature well above the maximum permissible cooling temperature, for example in the case of boiling cooling of railroad power supplies not above 70° C.
2. Solidification point well below the lowest cooling temperature, for example in the case of the boiling cooling of railroad power supplies in areas subject to hard winters not above −−340° C.
3. As high a heat of evaporation as possible in the boiling range, in order to reduce the mass flow because otherwise bottlenecks may arise in the case of small line cross-sections.
4. As high a specific heat as possible because this improves the heat storage capacity.
5. High thermal conductivity, low viscosity and surface tension enhance heat transfer during condensation. Viscosity and surface tension determine the film thickness of the condensate layer on cold surfaces. The more viscous the cooling fluid and the higher its surface tension, the thicker is the condensate layer.
6. Good dielectric properties, i.e. low dielectric coefficient, high electrical volume resistivity, low dielectric dissipation factor.
7. High disruptive voltage (>20 kV in the case of boiling cooling of railroad power supplies, >50 kV/cm when cooling transformers), measured at room temperature.
8. Good thermal stability, good stability in the event of voltage breakdowns.
9. Inert behavior with respect to materials.
10. Favorable physiological properties.
11. High degree of purity, free of contaminants.
12. Low content of incondensable gases (<1000 ppm, v/v), because such dissolved gases impair the heat transfer.
13. Good availability and economical preparation process, so that delivery at acceptable prices is ensured.
14. On safety grounds, non-flammable if possible.
15. On ecological grounds, environmentally safe if possible.

The publication "Two-Phase Cooling Evolution of High Power Semiconductors" by T. Jomard et al., EPE Firenze, 1991 (2), pages 491 to 496, presents various CFC 113 substitutes for boiling cooling of power semiconductors. They are perfluorohexane isomers and perfluorinated cyclic alkanes. In the view of the authors, they behave exactly like CFC 113, even better in some respects. However, their thermal capacity is somewhat lower than that of CFC 113.

The object of the present invention is to provide a cooling and insulating fluid for single- and two-phase convection, whose qualities are such that its thermodynamic and electrophysical properties are identical or similar to those of CFC 113, so as to avoid having to change the geometry of boiling-cooling vessels. Surprisingly, such a fluid was found in the form of "perfluoroisohexene" (dimeric hexafluoropropene), a mixture of isomers (CAS No. 84650-68-0), the mixture employed according to the invention comprising at least 80% by weight of the trans isomer and containing less than 3% by weight of perfluoro-2-methyl-2-pentene.

The components contained in the mixture have the following structural formulae:

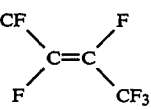

Component 1: (CF$_3$)$_2$CF, F / C=C / F, CF$_3$    trans isomer of perfluoro-4-methyl-2-pentene

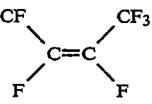

Component 2: (CF$_3$)$_2$CF, CF$_3$ / C=C / F, F    cis isomer of perfluoro-4-methyl-2-pentene

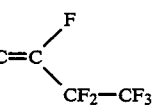

Component 3: CF$_3$, F / C=C / CF$_3$, CF$_2$—CF$_3$    perfluoro-2-methyl-2-pentene Preferably, mixtures are used comprising at least 88% by weight, especially at least 90% by weight, of component 1 and at most 2% by weight, especially at most 1% by weight of component 3.

A typical isomer mixture comprises, according to GC analysis, from 94 to 95% by area of component 1, from 4.5 to 5.5% by area of component 2, and from 0.2 to 0.3% by area of component 3. All the data reported hereinafter and experiments carried out with this fluid relate to such a composition, called "perfluoroisohexene".

The following table summarizes the thermodynamic and electrophysical data most relevant for cooling and insulating fluids of CFC 113 and of perfluoroisohexene:

TABLE

| | Unit | CFC 113 | Perfluoroisohexene |
|---|---|---|---|
| Boiling point or range | °C. | +47.6 | +45.5 to 49.5 |
| Critical temperature | °C. | +214.1 | +164.5 to 165.2 |
| Solidification point | °C. | −35.0 | −89.3 |
| Heat of evaporation in the boiling range | kJ/kg | 146.8 | 98.0 |
| Thermal conductivity of the liquid at +30° C. | W/m/K | 0.074 | 0.065 |
| Specific heat at +25° C. | kJ/kg/K | 0.96 | 1.13 |
| Kinematic viscosity at +20° C. | mm$^2$/s | 0.46 | 0.42 |
| Kinematic viscosity at −30° C. | mm$^2$/s | 0.99 | 0.78 |
| Surface tension at +25° C. | mN/m | 19.0 | 11.2 |
| Dielectric coefficient at +23° C., 1 kHz, 50% rel. humidity | | 2.41 | 1.82 |
| Electrical volume resistivity at +23° C. and 100 V | Ω · cm | $1.8 \cdot 10^{13}$ | $2.7 \cdot 10^{13}$ |
| Dielectric dissipation factor at 1 kHz and +23° C. | | $1.0 \cdot 10^{-4}$ | $2.0 \cdot 10^{-3}$ |
| Disruptive voltage at +20° C. | kV | 55 | 70 |

If the data of CFC 113 are compared with those of perfluoroisohexane, the following is found:

1. The boiling range of perfluoroisohexene and the boiling point of CFC 113 are of the same order of magnitude.
2. While the critical temperature of perfluoroisohexene is lower than that of CFC 113, it is likewise well above the maximum permissible cooling temperature in boiling-cooling vessels of railroad power supplies.
3. The solidification point of perfluoroisohexene is considerably lower than that of CFC 113. In contrast to CFC 113 there is no risk that perfluoroisohexene will freeze at extremely low ambient temperatures.
4. It is true that the heat of evaporation in the boiling range is higher for CFC 113 than for perfluoroisohexene. The mass flow of perfluoroisohexene is therefore greater than that of CFC 113. As, however, boiling-cooling vessels do not have any narrow line cross-sections, the greater mass flow cannot result in bottlenecks.
5. The viscosity of CFC 113 is higher, particularly at low temperatures, than that of perfluoroisohexene. The same applies to the surface tension. Both these factors are decisive for the film thickness of the condensate layer on cold surfaces. For perfluoroisohexene it is lower than for CFC 113. Admittedly, the thermal conductivity of CFC 113, on the other hand, is higher than that of perfluoroisohexene. All three physical parameters affect the heat transfer in condensation. Advantages and drawbacks roughly cancel each other out.
6. The specific heat, and thus the heat storage capacity, is higher for perfluoroisohexene than for CFC 113
7. The dielectric properties (dielectric coefficient, volume resistivity and dissipation factor) are at the same order of magnitude for both fluids, i.e. sufficient for the electrical insulation of railroad power supplies.
8. The disruptive voltage of perfluoroisohexene is higher than that of CFC 113.

It follows from the comparisons that perfluoroisohexene, in terms of boiling range, critical temperature and heat transfer during condensation and in terms of dielectric properties, can be regarded as equivalent to CFC 113, in terms of solidification point, heat storage capacity and disruptive voltage is superior to CFC 113. Only the mass flow is less in the case of CFC 113 than in the case of perfluoroisohexene which should be taken into account for the geometry of the cooling and insulating equipment to be employed. This is unnecessary when employing perfluoroisohexene in boiling-cooling vessels, because here there are no narrow line cross-sections.

The perfluoroisohexene is thermally stable, likewise in the event of voltage breakdowns. As with all perfluoroalkanes and perfluoroalkenes, thermal stress and spark-over may produce small amounts of perfluoroisobutene, a toxic gas. Surprisingly, it was found, however, that in the event of the perfluoroisohexene being subjected to thermal and/or electrical stress, perfluoroisobutene is broken down more rapidly in the presence of certain metals than with comparable perfluoroalkanes.

With respect to materials, perfluoroisohexene behaves in a similarly inert manner to CFC 113.

Perfluoroisohexene, in terms of acute oral toxicity, fish and bacterial toxicity, skin and eye irritation, is neither damaging to health nor irritating. Furthermore, it is not mutagenic (Ames test). Only upon inhalation of the vapors can any damage to health result. Since, however, the application according to the invention takes place in closed systems only, there is a risk of damage to health due to inhalation only in those cases where substantial amounts of perfluoroisohexene vapors escape from leaks of the closed equipment.

Perfluoroisohexene can be prepared according to the method of U.S. Pat. No. 2,918,501 and worked up by distillation to give a mixture of 98% of component 1 and 2% of component 3. More advantageous, however, is the method which was proposed in the U.S. patent application Ser. No. 08/111,643 filed Aug. 25, 1993. This application relates to a method for preparing dimers of hexafluoropropene having a high proportion of perfluoro-4-methyl-2-pentene and a low content of perfluoro-2-methyl-2-pentene, wherein the dimerization of the hexafluoropropene is carried out in an aprotic solvent in the presence of an adduct of an amine which does not contain an NH group and a metal fluoride. Preferentially, an amine is used which, per nitrogen atom, has three alkyl or alkylene groups which may contain ether oxygen atoms, or diamines or triamines are employed for the adduct. The aprotic solvent is preferably acetonitrile, and the metal fluoride is preferably potassium fluoride. Thus perfluoroisohexene having a high degree of purity is obtained (at least 99% of the isomer mixture). It is free of troublesome impurities such as water which may impair the electric insulation and stability parameters. The hydrofluoric acid and fluoride content are below 1 $\mu g/g$.

As incondensable gases—primarily air—may alter the disruptive voltage, but in any case considerably reduce the heat transfer and thus the capacity of a heat transfer system, such gases should, if possible, be eliminated from a cooling and insulating fluid. In the method proposed it is possible to reduce the content of incondensable gases to at most 1000 ppm (v/v).

Perfluoroisohexene is an "old substance"(known substance) and registered under EINECS No. 283-527-0.

Perfluoroisohexene, like CFC 113, is non-flammable and therefore has the advantage of greater safety compared to oils and glycols which are also used as CFC substitute. Its ignition point, 420° C., is so high that it cannot constitute a hazard at the usual application temperatures.

Perfluoroisohexene is a pure fluorine-carbon compound, is therefore chlorine-free in contrast to CFC 113, and therefore does not affect the ozone layer in the stratosphere. Its ozone depletion potential (ODP) is zero. Because of its relatively reactive double bond, its lifetime in the atmosphere is shorter than that of the saturated perfluoroalkanes which likewise are possible CFC 113 substitutes. Owing to its low acute toxicity to mammals (oral), bacteria and fish, though poor biological degradability, perfluoroisohexene should be classified as posing only a slight risk to water.

As measured by the requirements which must be made of a cooling and insulating medium and which have been described above in detail, perfluoroisohexene is very suitable for this particular application. It is suitable both as a medium for single-phase heat transfer and for cooling which employs two-phase convection, for example for cooling boiling or for use in heat pipes. In addition, it has good electrically insulating properties. It is thermally stable, compatible with materials, shows sufficiently favorable physiological behavior, is non-flammable and relatively safe environmentally.

Furthermore, it has been found that the perfluoroisohexene can be mixed with a minor amount of a highly fluorinated compound selected from the group consisting of a) alkanes having at least 3 carbon atoms, b) dialkyl ethers or c) mixtures of such alkanes and such ethers. Preferred are mixtures containing at least 60%, more preferred at least 70% by weight of perfluoroisohexene and especially azeotropic mixtures. Preferred fluoroalkanes have the formula $$C_nF_{2n+2-a}H_a$$

in which n is 3 to 6, preferably 4 to 6, and a is 1 to (n+1).

Preferred dialkyl ethers have the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1).

Flammable compounds can be used, too, provided the mixture is still inflammable.

The invention is explained in more detail by the following examples.

EXAMPLE 1

The cooling capacity of potential CFC 113 substitutes was measured in a boiling-cooling vessel for railroad power supplies and compared to that of CFC 113. The following fluids were tested:
1. perfluoroisohexene,
2. perfluoro-2-methylpentane, an isomer of perfluorohexane,
3. a mixture of n-perfluorohexane (main component), perfluoro-2-methylpentane and perfluoro-3-methylpentane.

The boiling-cooling vessel comprised a container with a fitted refrigerant condenser and a cover. The electrical components to be cooled—diodes in this case—were mounted on a support construction which was inserted in the container and fastened thereto by screwing. The diodes were completely immersed in the liquid in question. The cooling capacity to be measured was represented by the wattage of the diode output. In the case of fluid No. 1, i.e. perfluoroisohexene, it was exactly the same as for CFC 113, for fluid No. 2 it was 18% less, and for fluid No. 3 16% less.

EXAMPLE 2

To test the thermal stability of perfluoroisohexene, this fluid was stored in a sealed glass vial at 100° C. for 1000 hours. For comparative purposes, the same experiment was carried out with perfluoro-2-methylpentane (fluid No. 2 from Example 1). In both fluids, very small amounts of perfluoroisobutene, a toxic gas, were produced in the gas phase, namely 0.3 ppm (v/v) in perfluoroisohexene and 24 ppb (v/v) in perfluoro-2-methylpentane. Apart from this, both fluids remained unchanged.

EXAMPLE 3

Perfluoroisohexene was stored in a sealed glass vial at 300° C. for 100 hours in the pure form and with the addition of metal strips (high-grade steels with steel codes 1.4551 and 1.4571, nickel, zinc, copper, aluminum). In these experiments it was found, surprisingly, that in the sample containing metal additions 83% less perfluoroisobutene had formed than in the sample containing pure perfluoroisohexene. In the pure perfluoroisohexene, 4% of the trans isomer had been converted to the cis isomer. The proportion of perfluoro-2-methylpentane remained unchanged. In the sample containing metal additions, the trans-cis re-isomerization was 1%. The proportion of perfluoro-2-methylpentene rose to 0.3%.

EXAMPLE 4

Perfluoroisohexene and the perfluoroisohexane mentioned in Examples 1 and 2 were filled into separate containers and the containers were closed. In each case, a copper wire was positioned in the liquid phase, which was heated to red heat (approximately 490° C.) for three minutes. Surprisingly, less perfluoroisobutene was formed in this process in perfluoroisohexene than in perfluoroisohexane. The metals (copper of the wire, aluminum and high-grade steel of the container) clearly had a catalytic effect on the decomposition of the perfluoroisobutene, which was more evident in the case of perfluoroisohexene than in perfluoroisohexane. Apart from this, both fluids remained unchanged.

EXAMPLE 5

Perfluoroisohexene was subjected to 54 voltage breakdowns in a temperature range between −40° C. and +40° C. Less than 1 ppm (v/v) of perfluoroisobutene was formed. No isomerization took place.

EXAMPLE 6

Various metals and plastics were stored in the liquid and vapor phase of perfluoroisohexene at the boiling point for five days for 8 hours each. The following materials changed neither in weight nor in appearance: aluminum, high-grade steels having the steel codes 1.4551 and 1.4571, copper, black plate, tin plate, polyacetal resin as glass fiber-reinforced injection-molded type with trademark TM Hostaform C9021GV, polyphenylene sulfides with the trademarks TM Fortron 6165 A4 natur and 1140 L4 natur, polyethylene, high-molecular weight blow type with the trademark TM Hostalen GM 7746, polyvinyl chloride with the trademark TM Hostalit Z, aromatic co-polyesters with trademarks TM Vectra A 130, C 130 (both glass fiber-reinforced), A 530 (mineral-modified), A 625 (graphite-modified), C 810 (metallizable, mineral— and glass fiber-modified) and C 150 (glass fiber-reinforced), polypropylene types with trademarks TM Hostalen PPX 4207 (random copolymer), PPW 1752 (block copolymer having ethylene, propylene and rubber inclusions) and PPN 1060 (isotactic polypropylene).

EXAMPLE 7

In order to eliminate incondensable gases, a heatable container fitted with a motorized stirrer and a thermometer meter was charged with perfluoroisohexene. After the upper feed valve had been closed, the perfluoroisohexene introduced, while being stirred was heated up to the boiling point. Rising vapors of the perfluoroisohexene were condensed in two heat exchangers above the container. The condensate flowed back into the container. Uncondensed perfluoroisohexene vapors were freed of water vapor in a silica gel drier above the heat exchangers and absorbed in an activated carbon filter above the drier. After the boiling point had been reached, the hot perfluoroisohexene was drained via a lower drain valve, was cooled via an additional heat exchanger and filled into an evacuated steel bottle. In this manner, the content of incondensable gases was reduced to at most 1000 ppm (v/v).

Instead of pure perfluoroisohexene the following mixtures of perfluoroisohexene and highly fluorinated ethers can be used:

| Ether | % by weight of the mixture | boiling point*) (°C.) |
|---|---|---|
| $F_3C-CHF-CF_2-O-CH_3$ | 20 to 30 | 44 to 45 |
| $H-(CF_2)_2-O-C_2H_5$ | 15 to 25 | 43 to 44 |
| $F_3C-CH_2-O-(CF_2)_2-H$ | 15 to 25 | 44 to 45 |

*)of the azeotropic mixture

We claim:

1. A method of heat transfer, comprising the step of transferring heat to or from a heat transfer medium comprising a plurality of isomers of perfluorohexene, said plurality containing at least 80% by weight of the trans isomer of perfluoro-4-methyl-2-pentene and less than 3% by weight of perfluoro-2-methyl-2-pentene.

2. A method according to claim 1, wherein heat is transferred from an electronic component to said heat transfer medium.

3. A method according to claim 2, wherein the heat is transferred by the two-phase boiling cooling technique, said heat transfer medium being brought to a boil by the heat which is transferred thereto.

4. A method according to claim 1, wherein heat is transferred to said transfer medium, said heat transfer medium being a cooling medium.

5. A method according to claim 4, wherein said heat transfer medium is caused to boil by the heat which is transferred thereto.

6. A method according to claim 1, wherein said heat transfer medium is contained in a heat pipe.

7. A method according to claim 1, wherein heat energy is transferred from a first zone to be cooled to said heat transfer medium, and from said heat transfer medium to a second zone by single-phase convection of said heat transfer medium.

8. A method according to claim 1, wherein said heat transfer medium comprises at least 88% by weight of the trans isomer of perfluoro-4-methyl-2-pentene and at most 2% by weight of perfluoro-2-methyl-2pentene.

9. A method according to claim 8, wherein said heat transfer medium comprises at least 90% by weight of said trans isomer and no more than 1% by weight of perfluoro-2-methyl-2-pentene.

10. A method according to claim 1, wherein the content of air by volume in said heat transfer medium is at most 1000 parts per million parts by volume of said heat transfer medium.

11. A method according to claim 1, wherein a zone is insulated from temperature changes by means of heat transfer between said zone and said heat transfer medium.

12. A method of replacing the heat transfer medium 1,1,2-trichloro-1,2,2-trifluoroethane in a heat transfer device with a fluorine-carbon heat transfer medium without substantially changing the geometry of the heat transfer device, comprising: replacing the 1,1,2-trichloro-1,2,2-trifluoroethane with a plurality of isomers of perfluorohexene, said plurality containing at least 80% by weight of the trans isomer of perfluoro-4-methyl-2-pentene and less than 3% by weight of perfluoro-2-methyl-2pentene.

13. A method according to claim 1, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and
   c) mixtures of such alkanes and ethers, the complete mixture being non-flammable.

14. A method according to claim 2, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5 and (b+c) are 1 to (m+p+1) and
   c) mixtures of such alkanes and ethers, the complete mixture being non-flammable.

15. A method according to claim 3, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and
   c) mixtures of such alkanes and ethers, the complete mixture being non-flammable.

16. A method according to claim 4, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and
   c) mixtures of such alkanes and ethers, the complete mixture being non-flammable.

17. A method according to claim 5, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and
   c) mixtures of such alkanes and ethers, the complete mixture being non-flammable.

18. A method according to claim 6, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and
   c) mixtures of such alkanes and ethers, the complete mixture being non-flammable.

19. A method according to claim 7, wherein the said mixture contains as a further component a minor amount, referred to the perfluorohexenes, of a highly fluorinated compound selected from the group consisting of
a) alkanes of the formula $$C_nF_{2n+2-a}H_a$$

wherein
n is 3 to 6 and a is 1 to (n+1)
b) dialkyl ethers of the formula $$C_mF_{2m+1-b}H_b\text{—O—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

20. A method according to claim 8, wherein the said mixture contains as a further component a minor amount, referred to the perfluorohexenes, of a highly fluorinated compound selected from the group consisting of a) alkanes of the formula $$C_nF_{2n+2-a}H_a$$

wherein n is 3 to 6 and a is 1 to (n+1)

b) dialkyl ethers of the formula $$C_mF_{2m+1-b}H_b\text{—}O\text{—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

21. A method according to claim 9, wherein the said mixture contains as a further component a minor amount, referred to the perfluorohexenes, of a highly fluorinated compound selected from the group consisting of a) alkanes of the formula $$C_nF_{2n+2-a}H_a$$

wherein n is 3 to 6 and a is 1 to (n+1)

b) dialkyl ethers of the formula $$C_mF_{2m+1-b}H_b\text{—}O\text{—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

22. A method according to claim 10, wherein the said mixture contains as a further component a minor amount, referred to the perfluorohexenes, of a highly fluorinated compound selected from the group consisting of a) alkanes of the formula $$C_nF_{2n+2-a}H_a$$

wherein n is 3 to 6 and a is 1 to (n+1)

b) dialkyl ethers of the formula $$C_mF_{2m+1-b}H_b\text{—}O\text{—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

23. A method according to claim 11, wherein the said mixture contains as a further component a minor amount, referred to the perfluorohexenes, of a highly fluorinated compound selected from the group consisting of a) alkanes of the formula $$C_nF_{2n+2-a}H_a$$

wherein n is 3 to 6 and a is 1 to (n+1)

b) dialkyl ethers of the formula $$C_mF_{2m+1-b}H_b\text{—}O\text{—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

24. A method according to claim 12, wherein the said mixture contains as a further component a minor amount, referred to the perfluorohexenes, of a highly fluorinated compound selected from the group consisting of a) alkanes of the formula $$C_nF_{2n+2-a}H_a$$

wherein n is 3 to 6 and a is 1 to (n+1)

b) dialkyl ethers of the formula $$C_mF_{2m+1-b}H_b\text{—}O\text{—}C_pF_{2p+1-c}H_c$$

in which, independently, m and p are 1 to 4 with the proviso that (m+p) is not more than 5, and (b+c) are 1 to (m+p+1) and c) mixtures of such alkanes and ethers, the complete mixture being non-flammable.

25. The method as claimed in claim 13, wherein n is 4 to 6.

* * * * *